(12) United States Patent  
Neal et al.

(10) Patent No.: US 9,790,585 B2  
(45) Date of Patent: Oct. 17, 2017

(54) COATING SYSTEM AND PROCESS

(71) Applicant: UNITED TECHNOLOGIES CORPORATION, Hartford, CT (US)

(72) Inventors: James W Neal, Ellington, CT (US); David A Litton, West Hartford, CT (US); Russell A Beers, Manchester, CT (US); Benjamin Joseph Zimmerman, Moseley, VA (US); Michael J. Maloney, Marlborough, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 14/413,726

(22) PCT Filed: Jul. 31, 2013

(86) PCT No.: PCT/US2013/052816  
§ 371 (c)(1),  
(2) Date: Jan. 9, 2015

(87) PCT Pub. No.: WO2014/022452  
PCT Pub. Date: Feb. 6, 2014

(65) Prior Publication Data  
US 2015/0203954 A1    Jul. 23, 2015

Related U.S. Application Data

(60) Provisional application No. 61/677,622, filed on Jul. 31, 2012.

(51) Int. Cl.  
C23C 14/04 (2006.01)  
C23C 14/30 (2006.01)

(52) U.S. Cl.  
CPC .......... *C23C 14/042* (2013.01); *C23C 14/044* (2013.01); *C23C 14/30* (2013.01); *F05D 2230/313* (2013.01)

(58) Field of Classification Search  
None  
See application file for complete search history.

(56) References Cited

U.S. PATENT DOCUMENTS

| | | | |
|---|---|---|---|
| 4,373,470 A * | 2/1983 | Martin | C23C 14/042 118/504 |
| 4,530,861 A | 7/1985 | Sippel et al. | |
| 6,322,671 B1 | 11/2001 | Mingazhev | |
| 7,062,348 B1 | 6/2006 | Folta | |
| 7,422,771 B2 | 9/2008 | Pietraszkiewicz et al. | |
| 8,070,454 B1 | 12/2011 | Rawlings et al. | |
| 2003/0101932 A1* | 6/2003 | Kang | C23C 14/042 118/504 |
| 2009/0252872 A1 | 10/2009 | Saylor et al. | |
| 2012/0171045 A1 | 7/2012 | Spangler et al. | |

FOREIGN PATENT DOCUMENTS

KR    20070025958 A    3/2007

* cited by examiner

*Primary Examiner* — Joseph Miller, Jr.  
(74) *Attorney, Agent, or Firm* — Bachman & LaPointe, P.C.

(57) ABSTRACT

A coating system for coating a part (10), such as a turbine blade or vane, has a mask (14) positioned adjacent to a first portion (16) of the part (10) to be coated and a mechanism (30) for moving the mask (14) relative to the part (10). The mechanism (30) may be a gear mechanism or a magnetic mechanism.

5 Claims, 3 Drawing Sheets

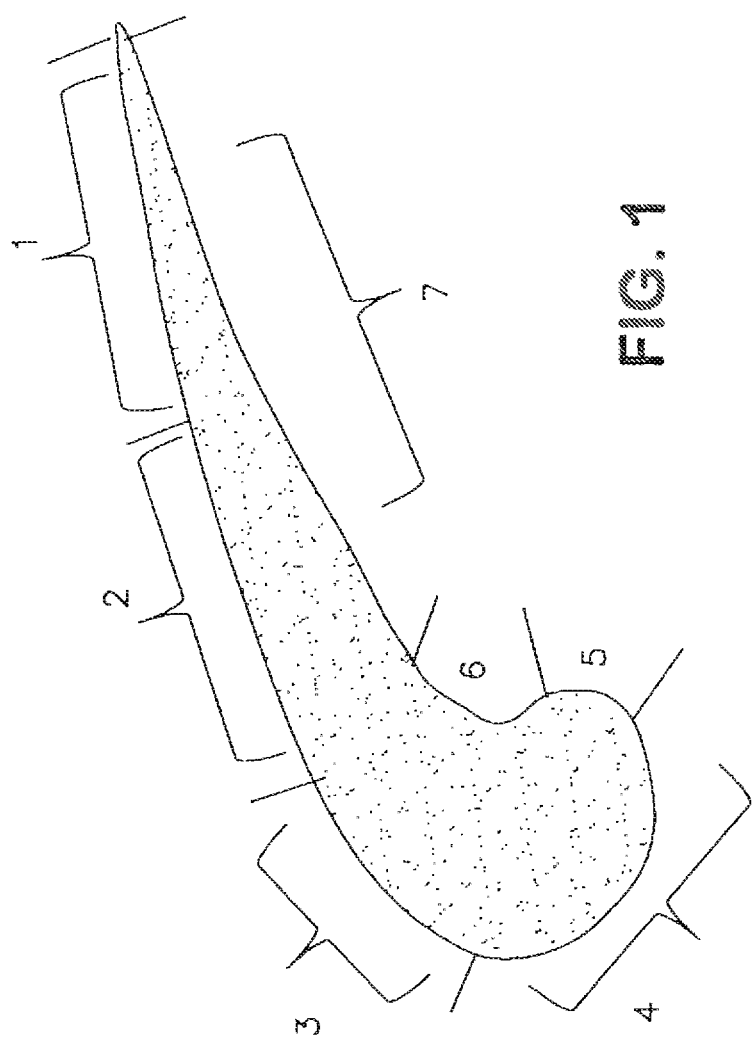

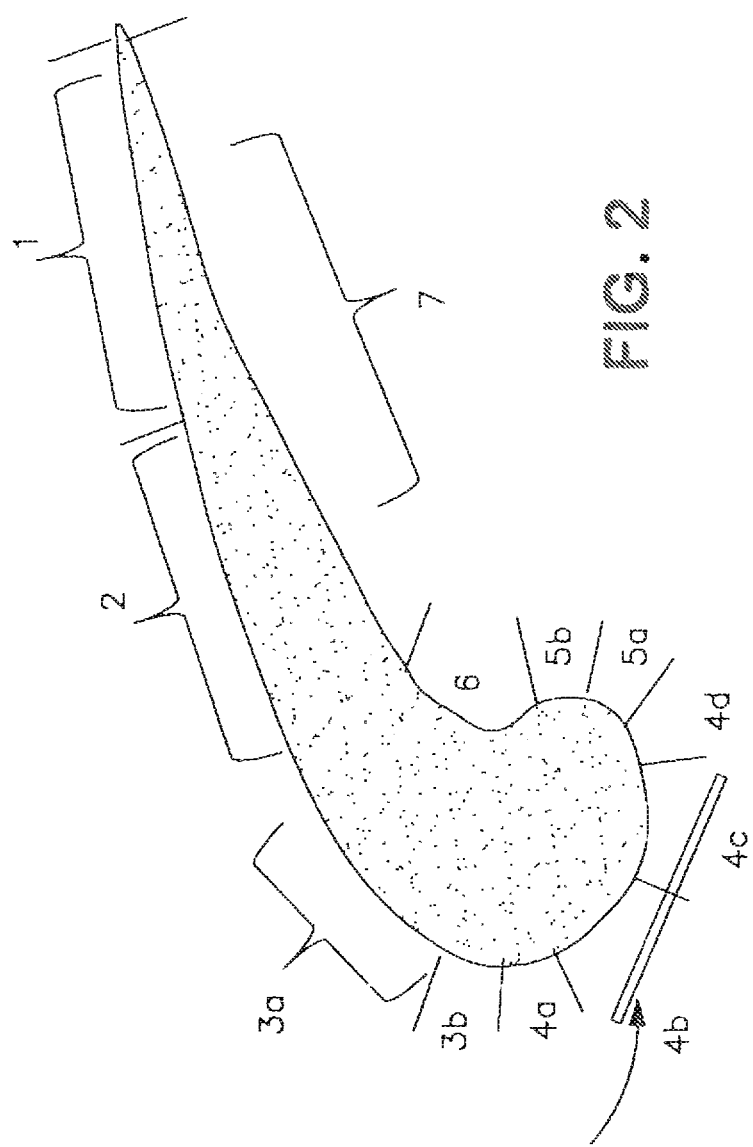

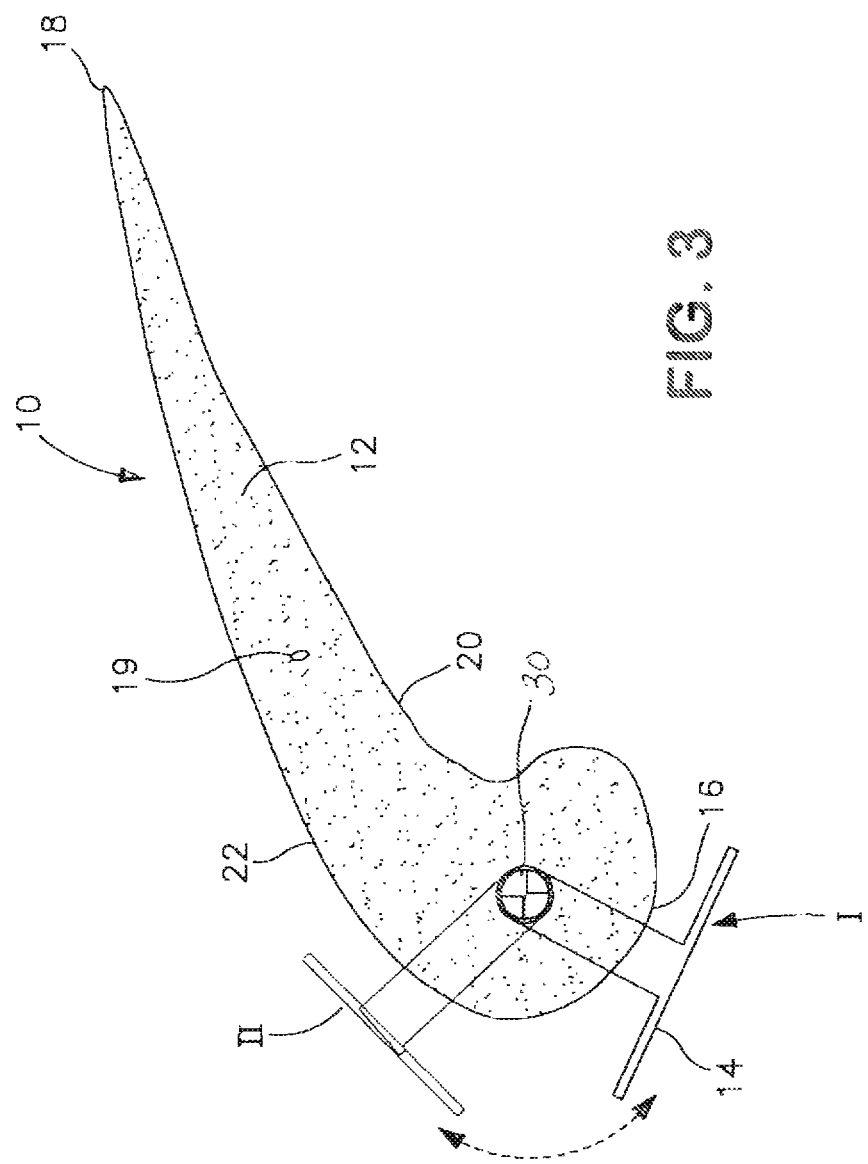

COATING SYSTEM AND PROCESS

BACKGROUND

The present disclosure relates to a coating system for coating a part, such as a turbine engine component, and to a process for coating the part.

During EB-PVD ceramic coating, gas turbine blades and vanes are placed into fixture cans to protect under platform surfaces from being coated. The fixture cans are moved spatially and rotated through the vapor cloud of coating material to deposit coating thicknesses on airfoil and platform surfaces. Tumblers and rake arms are commonly used to provide these motions.

In the tumbler approach, the longitudinal axis of the airfoil is maintained at a roughly constant angle relative to the vertical axis of the coater. The part rotates about its longitudinal axis and the longitudinal axis is translated around a circular path. Translation occurs at a rate of 1 to 30 RPM, and the rotation around the longitudinal axis occurs 4-10× slower.

In the rake approach, the longitudinal axis of the airfoil is swept over a range of angles relative to the vertical axis of the coater. The range of angles of the sweep is centered on the horizontal axis of the coater. The range of tilts is typically between −30 degrees and +30 degrees, but different tilting schemes are used for different parts. For example, vane tilting is often different from blade tilting. Independent of the tilting program, the part is rotated around its longitudinal axis at 10 to 40 RPM. The rotation rate of the airfoil in the tumbler approach is 5 to 10× slower than in the rake approach.

FIG. 1 illustrates a cross section of an unmasked part. EB-PVD is a line of sight process. The thickness and microstructure of the ceramic coating varies on different part surfaces due to the part geometry. The amount and average incidence angle of vapor arriving onto the part over a full period of manipulation varies for different part surfaces. The zones labeled in FIG. 1 roughly demarcate areas over which thickness and microstructure are roughly constant. However, transitions from zone to zone are relatively smooth, not abrupt. The abruptness of the transition is a function of the change in the radius of curvature of the surface.

It should be noted that the foregoing discussion is only valid at the midspan location of the blade, since as you move along the surface toward the platform, the platform begins to mask the vapor flux as well. Larger platforms, such as on vanes, results in more masking. The above discussion also ignores any features on the part fixtures or part manipulators that may get interposed between the part and the vapor source during the part manipulation during coating.

Zone 1 of the part receives high vapor flux, since no surface of the part gets interposed between the vapor source and this area during part manipulation. This area also gets closer to the vapor source relative to zone 2. Vapor incidence angle distribution is predominantly symmetrical and centered on the surface normal. This results in high thickness and optimal microstructure.

Zone 2 of the part receives high vapor flux, since no surface of the part gets interposed between the vapor source and this area during part manipulation. Vapor incidence angle distribution is predominantly symmetrical and centered on the surface normal. This results in high thickness and optimal microstructure, but less thickness than Zone 1 because Zone 1 gets closer to the vapor source.

Zone 3 of the part is very similar to Zone 1, but smaller radius of curvature reduces thickness slightly, relative to Zone 1. This zone also gets close to the vapor source. Vapor incidence angle distribution is predominantly symmetrical and centered on the surface normal. A smaller convex radius of curvature enhances the microstructure by increasing column diameter and the width of gaps between columns, which enhances strain tolerance.

Zone 4 of the part is very similar to Zone 3, but smaller radius of curvature reduces thickness slightly, relative to Zone 3. This zone also gets close to the vapor source. Vapor incidence angle distribution is predominantly symmetrical and centered on the surface normal. Still smaller convex radius of curvature further enhances the microstructure by increasing column diameter and the width of gaps between columns which enhances strain tolerance.

The significant difference between zone 5 and zone 4 is that the trailing edge of the part gets interposed between the vapor source and this surface over a portion of every part manipulation period. Vapor incidence angle distribution is not symmetrical though still centered on surface normal. This results in less thickness and a slight tilt to the growth angle of the ceramic columns relative to the surface normal. Columns grow slightly tilted away from the trailing edge since less vapor comes from that direction.

The significant differences between zone 6 and zone 4 is that both the leading edge and the trailing edge of the part gets interposed between the vapor source and this surface over a portion of every part manipulation period, and the surface curvature is concave, not convex. Vapor incidence angle distribution is less broad, though still centered on surface normal. The total vapor flux per part manipulation period is reduced for the same reason. Thus, this zone typically is the thinnest on the part. Since the change in surface curvature is more abrupt toward the leading edge than the trailing edge, the vapor incidence angle distribution is not symmetrical. Columns grow significantly tilted away from the leading edge, since less vapor comes from that direction than from the leading edge. The narrowing of the vapor incidence angle and the concave radius of curvature results in smaller column diameters and narrower gaps between columns. As a result, this zone has the lowest strain tolerance on the part.

Zone 7 is similar to zone 6, but lower concave radius of curvature and more distance from the results in less of an effect on the thickness and on the microstructure. Columns grow slightly tilted away from the trailing edge, since the trailing edge is closer than the leading edge, so the effect of trailing edge shadowing is greater, less vapor arrives from that direction.

As can be seen from the foregoing discussion, although the coating process is line of sight from the ingot source to the part, the airfoil geometry affects more coating on the leading and trailing edges of the part because of arc angle exposure time. To improve the thickness ratios between other airfoil surfaces and the edges, the edges are commonly masked with various forms of shadow bars or shields used to collect some of the coating.

Referring now to FIG. 2, there is shown a cross section of a part perpendicular to the longitudinal axis of the airfoil and with a masked leading edge. In zone 1, there is a minor change to the unmasked part since the presence of the leading edge mask casts a bigger shadow on the zone during some portion of the period of part manipulation, such that the coating would be slightly thinner with slightly smaller column diameters, and slightly smaller column boundary widths.

In Zone 2, there is a very small change relative to the unmasked part.

In Zone 3a, there is a small change relative to the unmasked part. The presence of the leading edge mask casts a bigger shadow on this zone during some portion of the period of part manipulation, such that the coating would be slightly thinner with slightly smaller column diameters, and slightly smaller columns.

In Zone 3b, there is a significant change in thickness and microstructure relative to the unmasked mart. The presence of the mask reduces coating thickness, reduces column diameters and narrows column boundary widths. Also the direction of columnar growth tilts away from the leading edge mask, due to reduced vapor coming from the direction of the leading edge mask.

In Zone 4a, there is a significant change in thickness and microstructure relative to the unmasked part. Columns are tilted the same direction as in Zone 3b, but are tilted at a larger angle relative to surface normal, since vapor is only coming from the gap between the mask and the part. The severe angles of columnar growth dramatically reduce erosion resistance, and spallation resistance, but to a lesser effect for the latter.

In Zones 4b and 4c are very similar, except the columns in Zone 4c tilt in the other direction.

Zone 4d is very similar to Zone 4a, but the columns tilt in the other direction.

The difference between Zone 5a on the masked part to Zone 5 on the unmasked part is a further narrowing of the vapor incidence angle distribution due to the presence of the mask that reduces coating thickness, column diameters and column boundary widths. Columnar growth is also tilted further toward the trailing edge since there is even less flux coming from the direction of the leading edge. This reduces the variability of the coating in this zone.

Zone 5b has a similar effect as in Zone 5a, but to a lesser degree. There is much less effect on degree of tilt on columnar growth than in Zone 5a.

Zone 6 has a very small change relative to the unmasked part.

Zone 7 has a minor change relative to the unmasked part. The presence of the leading edge mask casts a bigger shadow on this zone during some portion of the period of part manipulation, such that the coating would be slightly thinner with slightly smaller column diameters, and slightly smaller column boundary widths.

Sometimes trailing edge masks are used in lieu of the leading edge masks. The same effects would apply—significant thickness and microstructure changes close to the mask, and lesser effects further away.

Since these masks are attached to the fixture cans and are stationary relative to the airfoil, the coating below the masks may have a columnar structure that is off vertical, dependent on the size of the mask and its distance from the airfoil surface. Columnar coating structure that is off vertical quickly loses its fracture toughness, going to about zero at 45 degrees.

SUMMARY

The present disclosure involves a cyclic movement of a mask or shadow bar away from an area being masked or shadowed. This movement can be in distance as slight as the width of the mask, up to movement that encircles the part completely, the part and the mask rotating at different speeds. The mask's dimensions, its distance from the part, and its distance of movement can be engineered on a part geometry specific basis to effect requisite coating thickness ratios.

In accordance with the present disclosure, there is provided a coating system which broadly comprises a mask positioned adjacent to a first portion of a part (10) to be coated; and means for moving the mask relative to the part.

In a further embodiment, the first portion may be a leading edge of an airfoil portion of the part and the moving means may comprise means for moving the mask from a position adjacent the leading edge to a position adjacent a suction side of the airfoil portion.

In a further embodiment, the moving means may comprise a gear mechanism.

In a further embodiment, the moving means may comprise a magnetic system.

In a further embodiment, the mask may be indexable.

In a further embodiment, the mask may be cyclically moved from the first portion of the part.

In a further embodiment, the mask may be moved away from the first portion a distance as slight as a width of the mask.

In a further embodiment, the mask and the part may be rotated at different speeds.

In a further embodiment, the mask may be moved from the position adjacent to the leading edge to the position adjacent the suction side of the airfoil portion between 5 to 20 rotations of the part about a longitudinal axis thereof.

Further, in accordance with the present invention, there is provided a coating process which broadly comprises the steps of: positioning a part within a coating chamber; positioning a mask adjacent to a first portion of the part; creating a coating vapor within the coating chamber; and periodically moving the mask relative to the first portion of the part during the coating process.

In a further embodiment, the first portion may comprise a leading edge of an airfoil portion of the part and the step of periodically moving the mask may comprise moving the mask from a position adjacent the leading edge to a position adjacent a suction side of the airfoil portion.

In a further embodiment, the moving step may comprise moving the mask away from the leading edge a distance as slight as a width of the mask.

In a further embodiment, the coating process may further comprise providing a gear mechanism for moving the mask.

In a further embodiment, the coating process may further comprise providing a magnetic system for moving the mask.

In a further embodiment, the coating process may further comprise rotating the mask and the part at different speeds.

In a further embodiment, the mask moving step may comprise moving the mask every 5 to 20 rotations of the part about a longitudinal axis of the part.

Other details of the coating system and process are set forth in the following detailed description and the accompanying drawings wherein like reference numbers depict like elements.

BRIEF DESCRIPTION OF THE DRAWINGS

FIG. 1 is a cross sectional view of an unmasked part showing a cross section perpendicular to the longitudinal axis of the airfoil;

FIG. 2 is a cross sectional of a part with a masked leading edge showing a cross section perpendicular to the longitudinal axis of the airfoil; and FIG. 3 is a cross sectional view of a part with an indexable mask with the cross section being perpendicular to the longitudinal axis of the airfoil.

DETAILED DESCRIPTION

Referring now to FIG. 3, there is shown an airfoil portion 12 of a part 10 such as a turbine blade or vane. FIG. 3 shows a cross section perpendicular to the longitudinal axis of the airfoil portion 12. The airfoil portion 12 has a leading edge 16 and a trailing edge 18. The airfoil portion 12 also has a pressure side 20 and a suction side 22.

An indexable mask 14 is positioned adjacent the leading edge 16 of the airfoil portion 12. The indexable mask 14 may be moved as slight as a width of the mask 14. As can be seen, the mask 14 may be movable from a position I adjacent the leasing edge 16 to a position II adjacent the suction side 22 of the airfoil portion.

The mask may be moved by a gear mechanism (30) similar to that which moves the seconds, minutes and hours hand on a clock at different rates. In such a gear mechanism (30), one of the gears would have to be counter rotationable to be able to move the mask 14 back and forth.

In an alternative arrangement, the gear mechanism (30) may be a magnetic system.

In operation, the mask 14 may be moved quickly from position I to position II and vice versa. For example, the mask 14 may be moved from position I to position II every 5 to 20 rotations of the part 10 about its longitudinal axis 19.

Zones 2 and 3 of the part would be dramatically affected by the mask 14 as the mask 14 indexes over them. There would be a moderate effect on Zone 1. Since the thickness is highest and microstructure is best in zones 2 and 3, any reduction in coating quality would be acceptable. The remaining zones would have thickness and microstructure intermediate to the unmasked and the stationary masked part.

On a very fine microstructure scale (tens of microns), the columns in zones 4 and 5 would have a wave structure as the columnar growth would vary from tilted to vertical as the mask 14 indexes.

An improvement afforded by this coating system is that since EB-PVD parts are heated and kept hot by radiation, the indexing mask 14 would help to increase the steady state temperature of the leading edge area that was under the stationary mask, while decreasing substrate temperature on the suction side 22.

The part 10 may be coated by positioning the part 10 within a coating chamber (not shown). The mask 14 may then be positioned adjacent to a first portion, such as leading edge 16, of the part 10. Thereafter, a coating vapor may be created within the coating chamber using a process such as EB-PVD. The mask 14 may then be periodically moved relative to the first portion of the part 10 during the coating process in the presence of the coating vapor.

The mask 14 may be moved away from the first portion a distance as slight as the width of the mask 14.

During the coating operation, the mask 14 and the part 10 may be rotated at different speeds.

As noted above, the mask 14 may be moved from a first position (I) adjacent a leading edge 16 of the part 10 to a second position (II) adjacent the suction side 22 of the airfoil portion 12 between, or every, 5 to 20 rotations of the part 10 about its longitudinal axis 19.

The benefits of the coating system and process described herein further include vertical columnar coating microstructure deposited due to the periodic movement of the mask away from the area being shadowed. This allows direct line of sight coating for part of the coating cycle.

There has been provided by the instant disclosure a coating system and process. While the coating system and process have been described in the context of at least one specific embodiment thereof, other unforeseen alternatives, modifications, and variations will become apparent to those skilled in the art having read the foregoing description. Accordingly, it is intended to embrace those alternatives, modifications, and variations as fall within the broad scope of the appended claims.

What is claimed is:

1. A coating system comprising:
a mask positioned adjacent to a first portion of a part to be coated, wherein said mask is configured to be cyclically moved from said first portion of said part; and
means for moving said mask relative to the part, wherein said moving means comprises a gear mechanism, said gear mechanism includes one gear that is configured to be counter rotational configured to move said mask back and forth; wherein said first portion (16) is a leading edge of an airfoil portion of said part and said gear mechanism is configured to move said mask from a position adjacent said leading edge to a position adjacent a suction side of said airfoil portion between 5 to 20 rotations of the part about a longitudinal axis thereof.

2. The coating system of claim 1, wherein said mask is indexable.

3. The coating system of claim 1, wherein said mask is indexable.

4. The coating system of claim 1, wherein said mask is moved away from said first portion a distance as slight as a width of said mask.

5. The coating system of claim 1, wherein said mask and said part rotate at different speeds.

* * * * *